United States Patent [19]

Minkov et al.

[11] 4,166,225
[45] Aug. 28, 1979

[54] READ AMPLIFIER FOR INTEGRATED-CIRCUIT STORAGE DEVICE

[76] Inventors: Jury V. Minkov, 103527, korpus 903, kv. 155; Vladimir I. Solomonenko, 103489, korpus 710, kv. 73, both of Moscow, U.S.S.R.

[21] Appl. No.: 820,157

[22] Filed: Jul. 29, 1977

[30] Foreign Application Priority Data

Aug. 5, 1976 [SU] U.S.S.R. .................. 2393457

[51] Int. Cl.² .................. H03K 5/20; H03K 5/18; H03K 3/286; G11C 7/00
[52] U.S. Cl. .................. 307/355; 307/279; 307/DIG. 3; 307/DIG. 4; 365/205; 365/208
[58] Field of Search .................. 307/238, 279, 289, 291, 307/355, 356, 362, 363, DIG. 3, DIG. 4; 365/205, 207, 208

[56] References Cited

U.S. PATENT DOCUMENTS

| | | | |
|---|---|---|---|
| 3,795,898 | 3/1974 | Mehta et al. | 307/DIG. 4 X |
| 3,838,295 | 9/1974 | Lindell | 307/DIG. 3 X |
| 3,959,781 | 5/1976 | Mehta et al. | 307/DIG. 3 X |
| 4,031,522 | 6/1977 | Reed et al. | 307/DIG. 3 X |
| 4,039,861 | 8/1977 | Heller et al. | 307/DIG. 3 X |
| 4,054,865 | 10/1977 | Shirato | 365/208 X |
| 4,061,999 | 12/1977 | Proebsting et al. | 307/238 X |
| 4,069,475 | 1/1978 | Boettcher | 365/205 |
| 4,081,701 | 3/1978 | White, Jr. et al. | 307/DIG. 3 X |

OTHER PUBLICATIONS

Chu et al., "Low-Power, High-Speed Sense Latch", *IBM Tech. Discl. Bull.*, vol. 17, No. 9, pp. 2582-2583; 2/1975.
West, "Practical Design Using M.O.S.", *Design Electronics* (pub.), vol. 8, No. 6, pp. 30-32, 37, 38; 3/1971.

*Primary Examiner*—Larry N. Anagnos
*Attorney, Agent, or Firm*—Lackenbach, Lilling & Siegel

[57] ABSTRACT

A read amplifier for storage devices of high and super-high storage capacity includes two amplifier transistors whose sources are connected to a first control input, while each drain of these transistors is connected to one of two data outputs, respectively, two load transistors, whose drains are connected to a second control input, while each source of these transistors is connected to one of the two data outputs, respectively, two capacitors, each being connected between a third control input and the gate of one of the load transistors, respectively, and two switching transistors each having its drain connected to the gate of a respective load transistor, a first data output having connected thereto the source of a first and the gate of a second switching transistors and a second data output having connected thereto the source of the second and the gate of the first switching transistors.

1 Claim, 1 Drawing Figure

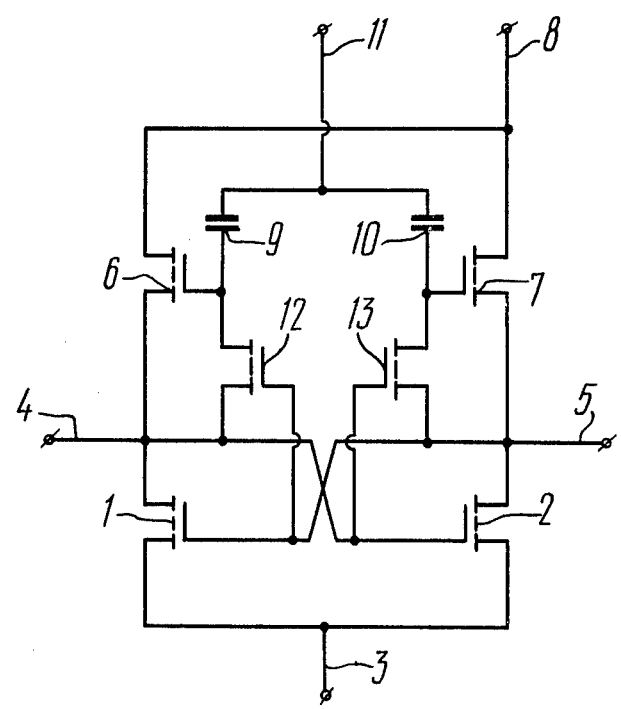

READ AMPLIFIER FOR INTEGRATED-CIRCUIT STORAGE DEVICE

FIELD OF THE INVENTION

The present invention relates to integrated circuits based on MOS(metal-oxide-semiconductor) structures and, more particularly, to a read amplifier for an integrated-circuit storage device, which may be used in random-access internal, read-only and reprogrammable storage devices as well as in storage devices based on charge-storage devices.

BACKGROUND OF THE INVENTION

Known in the art is a read amplifier for integrated-circuit storage devices, in which the sources of two amplifier transistors are connected to the first control input, each drain of these transistors being connected to one of two data outputs, each output also having connected thereto the source of one of two load transistors whose drains are connected to the second control input, and the third control input is electrically connected to the gates of the load transistors (Cf. "ELEKTRONIKA" No. 18, 1973, p. 77).

In the known read amplifier the steady state is maintained for some time required to complete the data readout from the entire storage.

In this case, power is continuously drained from the power source through one of the amplifier transistors and one of the load transistors.

Since the power consumed by the read amplifier constitutes a greater part of the whole energy drawn by the storage device, the appreciable portion of that power is lost in the process of readout.

The difference of potentials between the data outputs does not reach the peak value at a steady state of the read amplifier because there is no zero potential across the connection point of one of the data outputs due to the presence of a voltage divider formed by the load and amplifier transistors held in the on state, and the difference of potentials between the connection point of another data output and the drains of the load transistors does not reach the zero level because of threshold losses occurring in these transistors at the steady state of the read amplifier.

This noticeably limits the one-to-zero ratio (difference between the logic one and logic zero values) in entering data into storage elements.

As the read amplifier reaches its steady state, the source potential of one of the load transistors increases, and the potential across its gate does not exceed the potential of the power source because the gates of the load transistors are directly connected to the control input. As a result, there is a decreased difference of potentials between the gate and the source of the load transistor, which slows down the steady-state settling time and shows down the read amplifier speed.

BRIEF DESCRIPTION OF THE INVENTION

It is an object of the invention to reduce the power drain from a power source during the steady-state period of a read amplifier.

Another object is to increase the potential difference between the data outputs at the steady-state condition of the read amplifier.

Still another object is to increase the speed of the read amplifier for an integrated-circuit storage device.

With these and other objects in view, the invention resides in a read amplifier for an integrated-circuit storage device, wherein the sources of two amplifier transistors are connected to a first control input, each drain of these transistors is connected to one of two data outputs. Each of the data outputs is connected to the source of one of two load transistors, while their drains are connected to a second control input. A third control input is electrically connected to the gates of the load transistors. The read amplifier comprises, according to the invention, two capacitors each accomplishing electrical coupling between the third control input and the gate of a respective load transistor, and two switching transistors wherein each drain is connected to the gate of a respective one of the load transistors, the first data output having connected thereto the source of a first and the gate of a second switching transistors, and a second data output having connected thereto the source of the second and the gate of the first switching transistors.

BRIEF DESCRIPTION OF THE ACCOMPANYING DRAWING

The invention will now be explained in greater detail with reference to an embodiment thereof, taken in conjunction with the accompanying drawing illustrating a read amplifier for an integrated-circuit storage device, according to the invention.

DETAILED DESCRIPTION OF THE INVENTION

The proposed read amplifier for an integrated-circuit storage device comprises two FET amplifier transistors 1 and 2, whose sources are connected to a control input 3, while each drain of these transistors 1 and 2 is connected to one of two data input-output terminals 4 and 5, respectively.

The amplifier has two FET load transistors 6 and 7 whose drains are connected to a control input 8, while each source of these transistors 6 and 7 is connected to one of two data input-output terminals 4 and 5, respectively.

Each of capacitors 9 and 10 is connected between the gate of one of the transistors 6 and 7, respectively, and a control input 11.

The amplifier also comprises two FET switching transistors 12 and 13, whereof each drain is connected to the gate of a respective one of the load transistors 6 and 7.

Connected to the data input-output terminal 4 are the source of the transistor 12 and the gate of the transistor 13, and connected to the data input-output terminal 5 are the source of the transistor 13 and the gate of the transistor 12.

The read amplifier for an integrated-circuit storage device operates as follows:

In the initial state, the control input 8 is connected to a power source (not shown), whereby the reference voltage is present across the data input-output terminals 4 and 5 and the control input 3, while a low potential is across the control input 11.

The logic difference of potentials, read out of a storage location, causes a change in the difference of potentials between the input-output terminals 4 and 5.

Following the readout, a negative potential difference is applied to the control input 3 and a positive potential difference, to the input 11. In this case, the voltage across the gates of the load transistors 6 and 7 exceeds the voltage of the power source, which ensures operation of the load transistors 6 and 7 in the steep characteristic curve region.

Consequently, the read amplifier begins to assume the steady-state condition determined by the sign of the logic potential difference. As soon as the potential difference between the input-output terminals 4 and 5 becomes greater than the threshold voltage of the switching transistors 12 and 13, one of them, namely the one whose gate is connected to the input-output terminal 4 or 5, held at a high potential, turns on. If the transistor 12 turns on first, the capacitor 9 discharges through this switching transistor 12 to the output 4 held at a lower potential, while the load transistor 6 is turned off at this time. After the read amplifier has settled in the steady state, the load transistor 7 turns on and, being held in the steep characteristic curve region, maintains the potential of a respective input-output terminal 5 at a high level. In this case, the transistors 1 and 12 are also conducting and maintain the potential across a respective input-output terminal 4 of the amplifier and across the gate of the load transistor 6 at a low level. The transistors 6, 2 and 13 are turned off because their gate-to-source voltages are below the threshold voltage. Thus, the proposed circuit has no power drain path from the power source and the output signal across the input-output terminals 4 and 5 equals the supply voltage.

The absence of the power drain path at the steady-state condition of the read amplifier is essential for building integrated-circuit dynamic storage devices of high and superhigh capacity. The use of the proposed read amplifier enables the power drain of storage devices to be reduced 2 to 3 times. The load transistors 6 and 7 in this circuit are switched on by an increased voltage, which results in an increased speed of the amplifier, the size of the transistors 6 and 7 being the same. In many uses, an increase in the differential output signal is also of great importance. Thus, for example, at a supply voltage of 12 V, the output signal of the prior art amplifier is 7 V while that of the proposed amplifier is 12 V.

What is claimed is:

1. A read amplifier for an integrated-circuit storage device, comprising:
    a first FET amplifier transistor;
    a second FET amplifier transistor;
    a first control input connected to the sources of said amplifier transistors;
    a first data input-output terminal connected to the drain of said first amplifier transistor and to the gate of said second amplifier transistor;
    a second data input-output terminal connected to the drain of said second amplifier transistor and to the gate of said first amplifier transistor;
    a first FET load transistor whose source is connected to said first data input-output terminal;
    a second FET load transistor whose source is connected to said second data input-output terminal;
    a second control input connected to the drains of said load transistors;
    a third control input;
    a first capacitor connected between said third control input and the gate of said first load transistor;
    a second capacitor connected between said third control input and the gate of said second load transistor;
    a first FET switching transistor the drain of which is connected to the gate of said first load transistor the source of which is connected to said first data input-output terminal and the gate of which is connected to said second data input-output terminal; and
    a second FET switching transistor the drain of which is connected to the gate of said second load transistor the source of which is connected to said second data input-output terminal and the gate of which is connected to said first data input-output terminal.

* * * * *